United States Patent [19]

Rice et al.

[11] 4,031,531
[45] June 21, 1977

[54] SYNCHRO-TO-DIGITAL CONVERTER

[75] Inventors: Jeffrey C. Rice, McLean; Terry A. Tucker, Charlottesville, both of Va.

[73] Assignee: Sperry Rand Corporation, New York, N.Y.

[22] Filed: Jan. 12, 1976

[21] Appl. No.: 648,073

[52] U.S. Cl. .................. 340/347 SY; 340/347 AD; 340/347 M; 318/604

[51] Int. Cl.² ........................................ H03K 13/02

[58] Field of Search ............ 340/347 SY, 347 AD, 340/347 M; 318/604, 654

[56] References Cited

UNITED STATES PATENTS

| | | | |
|---|---|---|---|
| 2,850,240 | 9/1958 | Dickinson | 340/347 SY |
| 3,023,959 | 3/1962 | Rabin et al. | 340/347 SY |
| 3,136,987 | 6/1964 | Bock et al. | 340/347 SY |
| 3,533,097 | 10/1970 | Sleven | 340/347 SY |
| 3,898,648 | 8/1975 | Gariazzo | 340/347 SY |
| 3,914,759 | 10/1975 | Herchenroeder | 340/347 SY |

*Primary Examiner*—Thomas J. Sloyan
*Attorney, Agent, or Firm*—Howard P. Terry; Joseph M. Roehl

[57] ABSTRACT

Each output signal from a synchro device is applied to an individual voltage comparator through a step-down transformer. Each comparator is biased to a predetermined threshold level and produces an output signal whenever the magnitude of the associated synchro signal exceeds the threshold in the proper polarity. The comparator output voltages are applied to individual clocked flip-flops so as to produce binary output signals in a parallel format indicative of the rotor displacement of the synchro device.

3 Claims, 3 Drawing Figures

| STATE | S2-S3 / 29 | S3-S1 / 45 | S1-S2 / 47 |
|---|---|---|---|
| 1 | 1 | 1 | 0 |
| 2 | 0 | 1 | 0 |
| 3 | 0 | 1 | 1 |
| 4 | 0 | 0 | 1 |
| 5 | 1 | 0 | 1 |
| 6 | 1 | 0 | 0 |

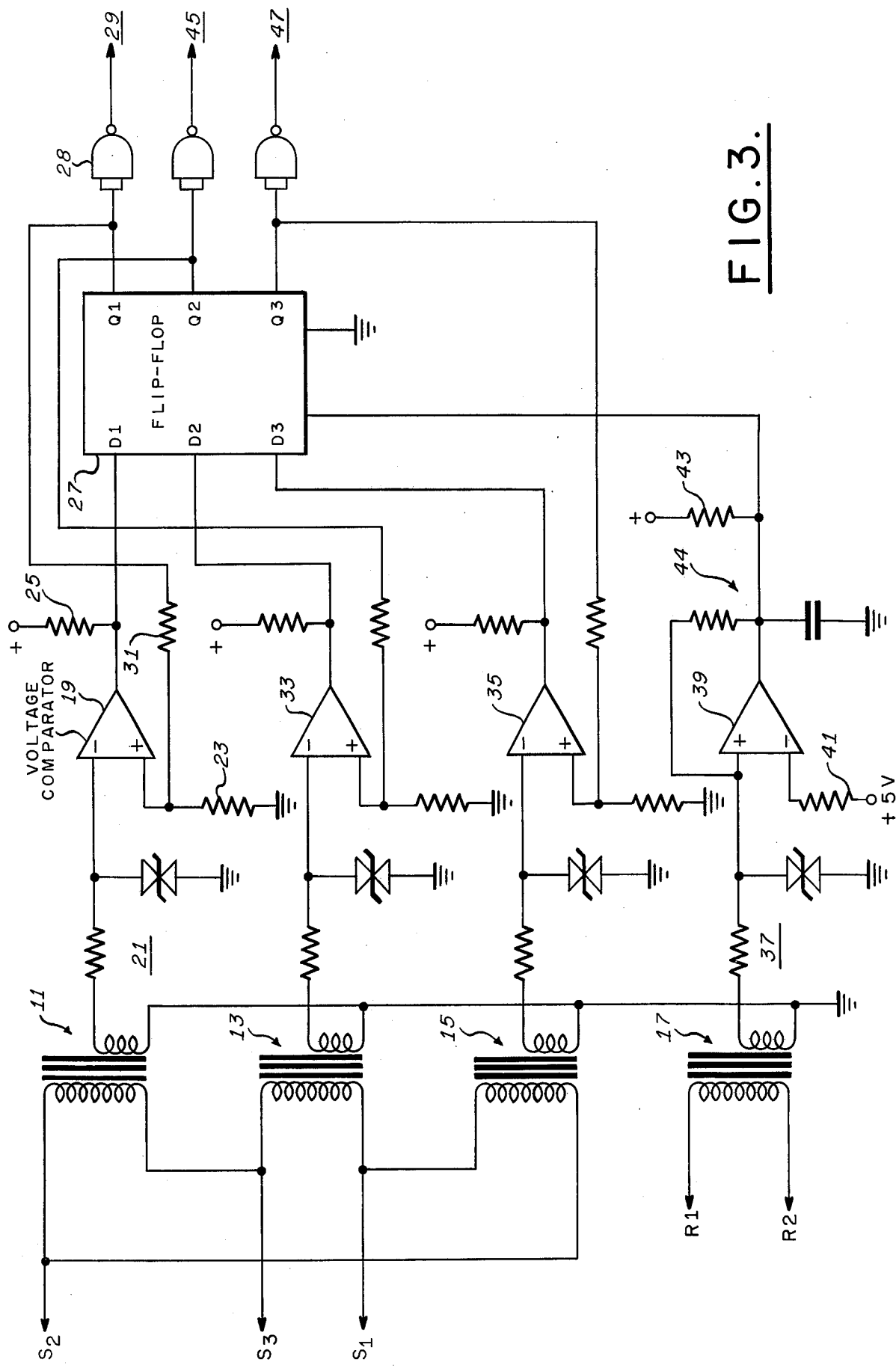

SYNCHRO-TO-DIGITAL CONVERTER

BACKGROUND OF THE INVENTION

1. Field of the Invention

The present invention relates to analog-to-digital converters, and more specifically to synchro-to-digital converters.

2. Description of the Prior Art

Various types of synchro-to-digital converters are known in the art.

Many of these prior art devices employ mechanical commutating means in which a commutator is attached to a rotatable shaft and coded so that a stationary sensing mechanism can detect a unique signal for any shaft displacement and translate this information into the desired signal format. However, such converters are bulky and subject to mechanical failure.

In another type of synchro-to-digital converter, the three-wire synchro signal is converted into two-wire sine and cosine equivalents. These signals are compared to determine the sector in which the angle to be measured lies and then converted into binary representations of the angle within that sector by means of successive approximations. Such devices produce an error function that is irregular and contains several discontinuities. Furthermore, such devices must be custom designed to encode a particular type of analog signal, and a separate channel must be supplied for each type of analog signal to be encoded.

U.S. Pat. No. 3,516,084 issued to Stephen J. Sacks and John E. Scott, entitled "Analog-to-Digital Converter", and assigned to the present assignee, concerns a synchro-to-digital converter in which the three-wire signal is converted into two-wire sine and cosine signals. The polarity of each of the sine and cosine signals as well as the relative magnitude of the two signals is determined and used to indicate the octant in which the angle corresponding to the input signal lies. Operational amplifiers are used to produce a linearized interpolation signal that can be encoded in conventional linear ratio encoders. Although this converter has great utility, the circuitry is relatively complex and not readily amenable to miniaturization.

SUMMARY OF THE INVENTION

Three-wire synchro signals representing an angular displacement are converted into equivalent digital signals by detecting the polarity of each synchro signal and translating this information into individual digital signals in parallel format, each having a binary value determined by the instantaneous polarity of the associated individual synchro signals.

BRIEF DESCRIPTION OF THE DRAWINGS

FIG. 3 is a diagram illustrating a circuit employing the principles of the invention.

DESCRIPTION OF THE PREFERRED EMBODIMENT

Figures 1, 2:
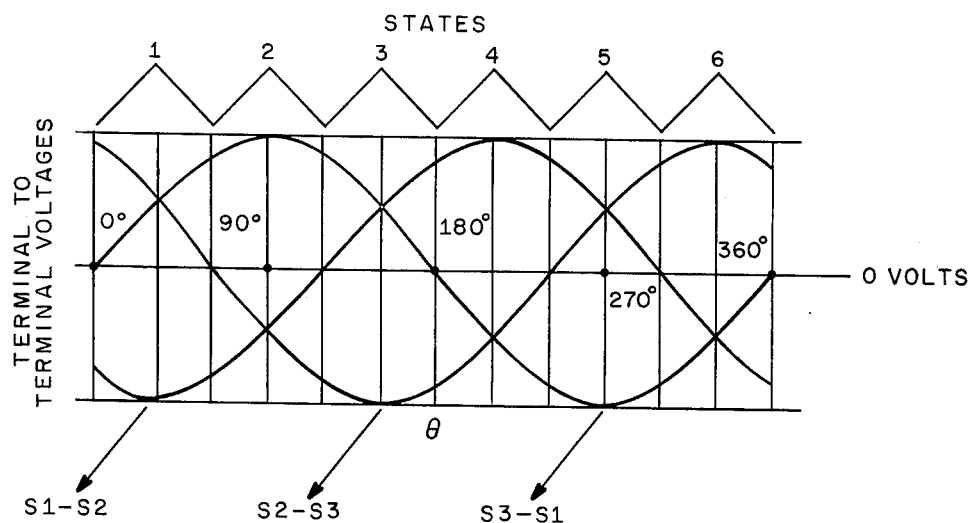
FIG. 1 is a graph useful in explaining the principles of operation of the invention.
FIG. 2 is a table summarizing the phenomena depicted in FIG. 1.

Synchro transmitters are widely used for transmitting electrical signals indicative of angular displacement. Such devices typically contain three stator windings and a wound rotor excited with alternating current. Voltages are induced in the stator windings by virtue of the magnetic field associated with the excited rotor winding and have magnitudes dependent upon the instantaneous angular position of the rotor. The stator windings in such devices are ordinarily connected in a star configuration, thus providing three stator output terminals. Output signals are taken from the terminals corresponding to each pair of adjacent stator windings.

FIG. 1 illustrates the manner in which the magnitude of the three single-phase voltages varies as a function of rotor position. For purposes of the present invention, a complete revolution of the rotor is visualized as traversing six equiangular states as depicted in FIG. 1. Reference to FIG. 1 reveals two facts upon which the operation of the invention depends: the polarity of each voltage remains unchanged throughout any given state; and the particular combination of the polarities of the three voltages is unique to any given state.

These two facts can be better visualized by referring to FIG. 2 wherein the numbers 1 and 0 associated with each voltage have been used to indicate positive or negative polarity of that voltage, respectively.

The manner in which the present invention uses these phenomena to a practical advantage may be understood by referring to the circuit diagram of FIG. 3.

The three stator voltages are applied between appropriate input terminals $S_1$, $S_2$ and $S_3$. The ac. voltage used to excite the rotor of the synchro is also applied to the terminals $R_1$ and $R_2$, and serves to form a clock voltage to synchronize the operation of the various components of the circuit. The various input voltages are applied to step-down transformers 11, 13, 15 and 17 to reduce the voltages to a suitable level. One side of the secondary winding of each of the transformers is referenced to ground. The opposite sides of the secondary windings of the transformers 11, 13 and 15, which may be connected in a delta configuration, are applied to identical channels for processing the respective signals. The ungrounded side of the secondary windings of the transformer 17 is applied to a clock circuit.

More specifically, the voltage from the transformer 11 is applied to the inverting terminal of a voltage comparator 19 through a conventional protective network 21. The voltage comparator is a straight-forward device and may, for instance, be a National Semiconductor Company part No. LM311.

The non-inverting input terminal of the voltage comparator 19 is referenced to ground potential through the series resistor 23. The switching signal output of the voltage comparator 19 is applied across a load resistor 25 and to the input terminal of a clocked flip-flop in the bank of flip-flops 27. Although individual flip-flops for each of the signal processing circuits may be used if desired, it is more convenient to use commercially integrated devices such as the "quad line driver" manufactured by Texas Instrument Company Part No. 74175, which contains a bank of four clocked flip-flops, each responsive to individual input signals during the occurrence of a single clock pulse. The output of the flip-flop associated with the voltage comparator 19 appears at the terminal $Q_1$ where it is applied through a buffer gate 28 to an output terminal 29 and through a feedback resistor 31 to the non-inverting input terminal of the voltage comparator 19.

The output signals from the secondary windings of the transformers 13 and 15 are applied to identical signal processing channels through the voltage comparators 33 and 35, respectively.

As mentioned previously, the exciting voltage applied to the rotor of the synchro whose signal is to be processed is applied to the input terminals $R_1$ and $R_2$, thence through the transformer 17 and the protective network 37 to the non-inverting input terminal of a voltage comparator 39. The inverting terminal of the comparator 39 is coupled to a source of positive offset bias through a series resistor 41. The output signal from the comparator 39 is applied across a load resistor 43 and to the clock input terminal of the bank of flip-flops 27. A straightforward R-C network 44 may be added to reduce switching noise if desired.

Because of the positive offset bias applied to the comparator 39 and the fact that the input signal applied to the transformer 17 is derived from the rotor excitation voltage, this clock circuit permits the output of the comparators in the three signal processing circuits to be strobed into the flip-flop at the peak value of the voltage applied to the $R_1$ lead so as to provide stable phase relationships.

To understand the operation of the circuit, assume that the voltage output of the transformer 11 is such that the voltage comparator 19 is cut off. Since the comparators are referenced to the zero voltage level, the comparator will produce a switching signal when the voltage from the transformer 11 crosses the zero axis. This switching signal will be applied to the terminal $D_1$ in the flip-flop 27. However, the flip-flop will not change state until the rotor excitation voltage applied to the transformer 17 reaches a sufficient level to strobe the flip-flop 27 through the voltage comparator 39. At this time, the voltage level at the terminal $Q_1$ of the bank of flip-flops 27 will change abruptly so as to provide a feedback signal to the resistor pair 23 and 31 which will effectively decrease the threshold so that the input signal immediately appears to be well beyond the threshold level. In effect, this feedback circuitry provides a hysteresis characteristic, which prevents spurious oscillations that might otherwise occur during the switching function.

The output signal from the terminal $Q_1$ is also applied to the output terminal through the buffer gate 28. The buffer gate typically may be a NAND gate which converts the low-level signals from the flip-flop to high power levels. It will be appreciated that the gate 28 is not essential to the operation of the invention and its use and exact nature will be dependent upon the particular load to be driven.

It will be understood that the synchro voltages applied to the input of the circuit of FIG. 3 typically occur at relatively high frequencies such as 60Hz or 400Hz as the case may be, whereas the angular position of the rotor synchro ordinarily occurs at slower speed.

It will also be understood that the sinusoidal curves of FIG. 1 are intended to depict the amplitudes of the ac. voltages appearing at the various output terminals of a synchro for any position of a synchro rotor, and furthermore, that since the clock circuit associated with the comparator 39 strobes the bank of flip-flops 27 from the rotor excitation voltage, the output voltages from the comparators 19, 33 and 35 are simultaneously sampled at the same point in each ac. cycle. The circuit of FIG. 3 effectively "rectifies" the waves of FIG. 1 and produces steady output voltages at each output terminal indicative of the "polarity" of the curves of FIG. 1 at any given rotor position.

Signals processed in the channels containing the voltage comparators 33 and 35 appear at the output terminals 45 and 47, respectively. The first clock pulse occurring after the rotor position enters a new state (FIG. 1) switches the individual flip-flop to a condition characteristic of that state. The flip-flops remain in the same condition until the rotor enters another state. Thus, the circuit produces a combination of high and low level steady voltages uniquely determined by the rotor position.

It will be remembered that the Table of FIG. 2 was used to summarize the conditions depicted in FIG. 1. It will be obvious that the same table can be used to summarize the conditions occurring at the output terminals 29, 45 and 47 wherein the output voltages are assigned conventional binary values. Reference to the table will reveal not only that each state is identified by a unique combination of output voltages, but that the format of voltages throughout the operating range conforms to a Gray code.

The circuit may be readily adapted to provide output voltages at a TTL level. In other applications, it may be preferred to apply the output voltages from the flip-flops to transistor voltage buffers suitable for driving a step motor.

While the invention has been described in its preferred embodiment, it is to be understood that the words which have been used are words of description rather than limitation and that changes within the purview of the appended claims may be made without departing from the true scope and spirit of the invention in its broader aspects.

We claim:

1. A synchro-to-digital converter comprising individual transformer means to receive the three stator output voltages and a sample of the rotor excitation voltage from an external synchro, individual channels coupled to said transformer means for processing each stator voltage, and means to produce a clock pulse at a predetermined point in each cycle of the rotor excitation voltage; each of said channels including voltage comparator means having a first input terminal coupled to receive a stator output voltage from the associated transformer means and a second input terminal for applying a threshold potential to the comparator so that the comparator produces a switching signal when and only when the associated stator output voltage exceeds the threshold potential, bistable switching means coupled to receive switching signals from the comparator in the same channel, said bistable means being constructed and arranged to switch to first or second bistable states in response to a clock pulse occurring in the presence or absence, respectively, of a switching signal, said second input terminal being coupled to ground potential through a resistance element and to the output of said bistable switching means through a feedback loop so that said threshold potential is at ground level in the absence of a switching signal but is depressed to a lower level at the inception of a switching pulse, output means on each switching means for producing steady output signals indicative of the bistable state of the switching means in the corresponding channel, the output means in the three channels being arranged to provide simultaneous binary-valued output signals in a known digital code format.

2. The converter of claim 1, wherein the means to produce a clock pulse includes additional comparator means biased to an offset voltage such that a clock pulse is produced at a time in each cycle of the rotor excitation voltage when that voltage is near its peak value.

3. A synchro-to-digital converter comprising three input transformers connected in a delta configuration for receiving stator output voltages from an external synchro transmitter and a fourth transformer for receiving a sample of the rotor excitation applied to the synchro, each of said transformers having a secondary winding with one side connected to ground, said converter further including a plurality of channels for individually processing each stator output voltage, each of said channels including a voltage comparator and a clocked flip-flop, each of said voltage comparators being referenced to a ground potential threshold level through a resistance element and having an input terminal connected to the ungrounded side of the secondary winding of a different one of said delta connected transformers so that each of said voltage comparators produces a switching signal only when the voltage at its input terminal exceeds the threshold level, said converter further including a clock pulse-forming circuit including a voltage comparator coupled to the secondary of said fourth transformer and biased to an offset voltage so as to produce a clock pulse whenever the sampled rotor excitation voltage nears its peak value in a given polarity, each of said clocked flip-flops being coupled to receive said clock pulses and output signals from the voltage comparator in the associated channel so that the flip-flop will be switched to a state determined by the output of the voltage comparator in the same channel in response to a clock pulse, said converter further including individual feedback means in each channel coupled between the output of a flip-flop and the associated voltage comparator so as to reduce the threshold of that comparator in response to a switching signal from the comparator, said clocked flip-flops having their output terminals arranged to provide simultaneous binary-valued output signals in a known digital code format.

* * * * *